(12) United States Patent
Oota et al.

(10) Patent No.: US 10,734,995 B1
(45) Date of Patent: Aug. 4, 2020

(54) OUTPUT CIRCUIT

(71) Applicant: KABUSHIKI KAISHA TOYOTA CHUO KENKYUSHO, Nagakute-shi, Aichi (JP)

(72) Inventors: Norikazu Oota, Nagakute (JP); Kanae Murata, Nagakute (JP); Takashi Ozaki, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 0 days.

(21) Appl. No.: 16/717,035

(22) Filed: Dec. 17, 2019

(30) Foreign Application Priority Data

Feb. 12, 2019 (JP) .................................. 2019-022862

(51) Int. Cl.
*H03K 17/687* (2006.01)
*H03K 19/0185* (2006.01)

(52) U.S. Cl.
CPC . *H03K 17/6871* (2013.01); *H03K 19/018507* (2013.01)

(58) Field of Classification Search
CPC ..... H03K 19/00361; H03K 19/018507; H03K 19/00315; H03K 19/018521; H03K 17/04126; H03K 17/063; H03K 17/0822; H03K 17/6871; H03K 17/6872; H03K 17/693; H03K 2217/0036; H04L 25/028; H04L 25/0272
See application file for complete search history.

(56) References Cited

U.S. PATENT DOCUMENTS

2004/0104743 A1* 6/2004 Honda ............. H03K 17/04123
326/81
2006/0226884 A1* 10/2006 McCaughey .......... H03K 3/012
327/208

FOREIGN PATENT DOCUMENTS

| JP | 2006-094301 A | 4/2006 |
| JP | 2014-027515 A | 2/2014 |
| JP | 2019-036818 A | 3/2019 |

* cited by examiner

*Primary Examiner* — Long Nguyen
(74) *Attorney, Agent, or Firm* — Oliff PLC

(57) ABSTRACT

An output circuit may be provided with: input and output terminals; a ground terminal shared by both an input side and an output side; a first switching element of n-channel type having first positive and negative electrodes, and a first gate; a second switching element of the n-channel type having second positive and negative electrodes, and a second gate; a diode; and a resistive element; in which the first positive electrode is connected with a power source, the first negative electrode is connected with the output terminal, anode of the diode is connected with the first negative electrode, cathode of the diode is connected with the first gate, the resistive element is connected between the source and the first gate, the second positive electrode is connected with the first gate, the second negative electrode is connected with the ground terminal, and the second gate is connected with the input terminal.

4 Claims, 5 Drawing Sheets

OUTPUT CIRCUIT

CROSS-REFERENCE TO RELATED APPLICATION

This application claims priority to Japanese Patent Application No. 2019-022862 filed on Feb. 12, 2019, the contents of which are hereby incorporated by reference into the present application.

TECHNICAL FIELD

The teaching disclosed herein relates to an output circuit. Especially, the teachings disclosed herein relates to an output circuit configured to convert low voltage input pulse signal to high voltage output signal.

BACKGROUND

An output circuit configured to switch a voltage of an output terminal between a ground potential and a power source potential (power source voltage) is known. A typical output circuit includes two switching elements connected serially between a ground and a power source, and a midpoint of this serial connection is connected with the output terminal. Hereinbelow, for the convenience of explanation, of two switching elements having a midpoint therebetween connected to an output terminal, the switching element on a high-potential side will be termed an upper switching element and the switching element on a low-potential side will be termed a lower switching element. When the upper switching element is maintained in an on-state and the lower switching element is maintained in an off-state, the output terminal is maintained at a power source voltage. When the upper switching element is switched off and the lower switching element is switched on, the output terminal is switched to a ground potential. A signal outputted from the output terminal is therefore a pulse signal having a LOW level being at the ground potential and a HIGH level being at the power source voltage.

Generally, a switching element of a p-channel type is used as the upper switching element and a switching element of a n-channel type is used as the lower switching element. The switching element of the p-channel type is switched between on and off by a pulse signal with a voltage amplitude that is lower than the power source voltage with a potential of a positive electrode of the switching element as a reference. The switching element of the n-channel type is switched between on and off by an input pulse signal with a voltage amplitude that is lower than the power source voltage with a potential of a negative electrode of the switching element as a reference. A "positive electrode of a switching element" refers to an electrode located on an input side where current flows in (thus a drain electrode in a case of a field effect transistor of the n-channel type), and a "negative electrode of the switching element" refers to an electrode on an output side where the current flows out (thus a source electrode in the case of the field effect transistor of the n-channel type).

In a case with an output circuit supplied with an input pulse signal with a low voltage with a ground potential as a reference, on/off control of its lower switching element can be executed by inputting the input pulse signal directly to a gate of the lower switching element of the n-channel type. On the other hand, for gate control of a switching element of the p-channel type, the gate control of its upper switching element must be executed by generating a signal that intensified the HIGH level of the input pulse signal to the power source voltage by using a level conversion circuit. An example of the level conversion circuit is described in JP 2006-94301 A (Patent Literature 1). The level conversion circuit requires a plurality of elements. In the level conversion circuit of Patent Literature 1, four transistors are required. A serial connection that uses a MOS (Metal-Oxide-Semiconductor) transistor of the p-channel type as its upper switching element and a MOS transistor of the n-channel type as its lower switching element is called a CMOS (Complementary MOS) circuit, and such is widely used (e.g., see Patent Literature 1).

In an output circuit that uses a serial connection of two switching elements on an output side, current may flow directly from a power source to a ground upon when on/off of upper and lower switching elements switch. Such current is called "through-current". The circuit could be damaged with large through-current. An output circuit described in JP 2014-27515 A (Patent Literature 2) switches one of its switching elements from on to off, after which it switches another switching element from off to on responsive to a turnoff signal of the one of the switching elements. By doing so, it avoids an occurrence of a period during which both switching elements are turned on, thereby suppressing through-current.

SUMMARY

The output circuit described in Patent Literature 2 suppresses the through-current by providing a complicated circuit on an upstream(input) side of a CMOS circuit. The description herein provides an output circuit configured to suppress through-current with a circuit configuration that is more simplified than conventional configurations.

An output circuit disclosed herein may comprise two n-channel voltage-driven switching elements (first and second switching elements), a diode, a resistive element, an output terminal, an input terminal, and a ground terminal. A pulse signal is inputted to the input terminal. The ground terminal is shared by an input side and an output side of the output circuit. For the convenience of explanation, a positive electrode, a negative electrode, and a gate of the first switching element are respectively termed a first positive electrode, a first negative electrode, and a first gate. A positive electrode, a negative electrode, and a gate of the second switching element are respectively termed a second positive electrode, a second negative electrode, and a second gate. As aforementioned, in a case of a field effect transistor of a n-channel type, the positive electrodes correspond to drains and the negative electrodes correspond to sources.

The first positive electrode of the first switching element is connected with a power source and the first negative electrode thereof is connected with the output terminal. An anode of the diode is connected with the first negative electrode and a cathode is connected with the first gate. The resistive element is connected between the power source and the first gate. The second positive electrode of the second switching element is connected with the first gate and the second negative electrode thereof is connected with the ground terminal. The input terminal is connected with the second gate.

In the output circuit disclosed herein, the second switching element is maintained in an on-state when a pulse signal inputted to the input terminal (hereinbelow termed an input pulse signal) is at a HIGH level. Since the first gate connected with the second positive electrode of the second switching element is maintained at a ground potential, the first switching element is maintained in an off-state. As a result, the output terminal is maintained at the ground potential. That is, the output terminal is maintained at a LOW level.

When the input pulse signal switches from a HIGH level to a LOW level, the second switching element immediately turns off. When the second switching element turns off, the first gate is raised to a power source voltage and the first switching element thereby turns on (to be more specific, the first switching element shifts to a source follower operation, as this will be described later). When the first switching element turns on, the power source electrically connects to the output terminal through the first switching element, by which a voltage of the output terminal is raised to the power source voltage (HIGH level). Since the first switching element turns on after the second switching element has been turned off, no through-current flows in the circuit.

To be more precise, the voltage of the output terminal, that is, a voltage of the first negative electrode of the first switching element, is maintained at a voltage that is lower than the power source voltage by a threshold voltage of the first switching element. As aforementioned, the first gate is maintained at the power source voltage. The first switching element is of the n-channel type, and its on/off switches by a voltage difference between the first negative electrode and the first gate. Due to the first negative electrode and the first gate being connected via the diode, the first switching element repeats to switch between on and off according to a state of a load connected with the output terminal such that the voltage of the first negative electrode (that is, the output terminal) is maintained at "power source voltage−threshold voltage". An operation in which the voltage of the first negative electrode (source) is maintained constant regardless of changes in the load is called source follower (source follower operation).

A state in which the voltage of the output terminal is at "power source voltage−threshold voltage" corresponds to a HIGH level of the output terminal. When the power source voltage is higher than the HIGH level of the input pulse signal, the HIGH level of the input pulse signal is changed to a voltage level higher than the power source voltage. That is, the output circuit is configured to amplify the HIGH level of the input pulse signal and output the same.

When the input pulse signal is at the LOW level, the diode is in an off-state. When the input pulse signal switches from the LOW level to the HIGH level, the second switching element immediately switches from off to on. When the second switching element switches from off to on, the voltage of the second positive electrode (that is, the first gate) starts to drop. When the voltage of the first gate starts to drop, the first switching element immediately switches from on to off. Since the output terminal (first negative electrode) and the first gate are connected via the diode, the diode switches from off to on when the voltage of the first gate drops by a forward voltage of the diode relative to the voltage of the output terminal. Since the diode turns on after the first switching element has been turned off, no through-current flows in the circuit. After this, the voltage of the output terminal drops accompanying a voltage drop in the second positive electrode. That is, the output terminal switched from the HIGH level to the LOW level.

As above, in the output circuit disclosed herein, the through-current is suppressed in both cases where the input pulse signal switches from the LOW level to the HIGH level as well as where it switches from the HIGH level to the LOW level. The art disclosed herein enables to realize an output circuit configured to suppress through-current simply by using two switching elements, a resistive element, and a diode.

When the voltage difference Vgs between the first negative electrode and the first gate of the first switching element becomes excessively large, a load applied to the first switching element becomes large. If the voltage of the second positive electrode (that is, the first gate) abruptly drops when the second switching element switches from off to on, a voltage drop in the output terminal cannot follow this due to a response delay generated when the diode switches from off to on, by which the voltage difference Vgs might become large. To address this, an additional resistive element having a smaller resistance than the aforementioned resistive element may be connected between the second negative electrode and the ground terminal. By employing this additional resistive element, a speed by which the second switching element switches from off to on (switching rate) becomes slower, and an influence of the response delay generated when the diode switches from off to on can thereby be cancelled. As a result, the voltage difference Vgs is suppressed from becoming large.

On the other hand, the load on the first switching element also becomes large when the voltage of the output terminal (first negative electrode) drops significantly below the voltage of the first gate. To address this, the diode connected between the first gate and the first negative electrode may be a Zener diode. The Zener diode allows current to flow from the cathode to the anode as well when a reverse bias voltage becomes larger than a threshold. By incorporating the Zener diode, the current flows from the first gate to the first negative electrode when the voltage of the output terminal drops to an abnormal level, by which the voltage difference Vgs is suppressed from becoming large.

The art related to the output circuit as described above may be adapted to an output circuit configured to convert a level of an input pulse signal of a low voltage to a pulse signal having a LOW level with a high voltage being of a negative value. In this case, two p-channel type voltage-driven switching elements are employed. For the convenience of explanation, in order to distinguish the output circuit configured to convert to a pulse signal having a LOW level with a high voltage being of a negative value from the aforementioned output circuit, it will be termed an output circuit for a negative value.

A preferred configuration of the output circuit for the negative value is as follows. The output circuit for the negative value includes an input terminal, an output terminal, a circuit power terminal, a drive power terminal, two switching elements of a p-channel type (namely, a first switching element and a second switching element), a diode, and a resistive element. The circuit power terminal is connected with a first power source configured to supply a first voltage, the first voltage being of a positive value. Power supplied by the first power source is used for driving a logic circuit including the switching elements. The drive power terminal is connected with a second power source configured to supply a second voltage, the second voltage being of a negative value. Power supplied by the second power source (being the power with the voltage of the negative value) is used as power for driving a load connected with the output terminal.

Both the first switching element and the second switching element are p-channel voltage-driven switching elements. For the convenience of explanation, a positive electrode, a negative electrode, and a gate of the first switching element are respectively termed a first positive electrode, a first negative electrode, and a first gate, and a positive electrode, a negative electrode, and a gate of the second switching element are respectively termed a second positive electrode, a second negative electrode, and a second gate. With a switching element of the p-channel type, a source corresponds to the positive electrode and a drain corresponds to the negative electrode. The first positive electrode is connected with the output terminal, and the first negative electrode is connected with the drive power terminal. An anode of the diode is connected with the first gate and a cathode thereof is connected with the first positive electrode. The resistive element is connected between the first gate and the drive power terminal. The second positive electrode is connected with the circuit power terminal and the second negative electrode is connected with the first gate. The second gate is connected with the input terminal. Since an operation of the output circuit of the negative value is principally similar to that of the aforementioned output circuit, detailed descriptions therefor will be omitted. The output circuit of the negative value is also configured to suppress the through-current and convert an input pulse signal to an output pulse signal having a LOW level of a negative value.

Details and further improvements of the art disclosed herein will be described in DETAILED DESCRIPTION below.

DETAILED DESCRIPTION

First Embodiment

Figure 1:
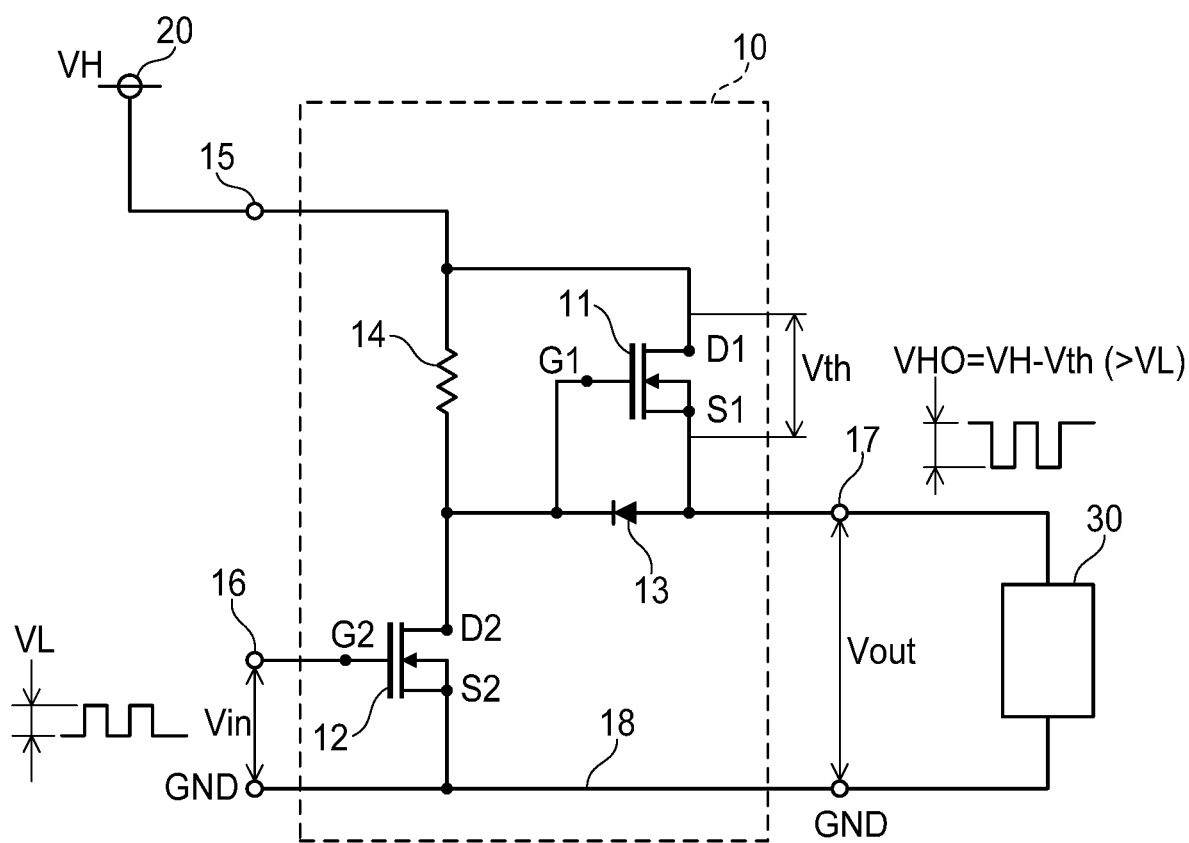
FIG. 1 is a circuit diagram of an output circuit of a first embodiment.

An output circuit of a first embodiment will be described with reference to FIGS. 1 and 2. FIG. 1 shows a circuit diagram of an output circuit 10. The output circuit 10 is a circuit configured to convert (amplify) a voltage level of a pulse signal (input pulse signal) inputted between an input terminal 16 and a ground terminal 18 and output the same. The output circuit 10 is configured to convert the input pulse signal having a HIGH level of a voltage VL to an output pulse signal having a HIGH level of a voltage VHO (>voltage VL) and output the same. The HIGH level (voltage VHO) of the output pulse signal is at a value that is lower than the power source voltage VH by a threshold voltage Vth (voltage drop Vth) of a first transistor 11 (to be described later). The threshold voltage Vth is about 0.5 to 1.0 [volts], and is significantly small as compared to the power source voltage VH (10 to 200 volts). That is, a voltage level of the output pulse signal is substantially at the power source voltage VH.

In the output circuit 10 of FIG. 1, the output pulse signal is an inverted signal of the input pulse signal. For a case where a non-inverted signal is to be outputted, an inverter element may be added to the input terminal 16 or to an output terminal 17.

The output circuit 10 is used for driving a load that operates by a pulse signal having a ground level (LOW level) and the voltage VHO (HIGH level). An example of the load is a piezoelectric actuator.

The output circuit 10 includes two transistors (namely a first transistor 11 and a second transistor 12), a diode 13, a resistive element 14, a power terminal 15, the input terminal 16, the output terminal 17, and the ground terminal 18. The two transistors 11, 12 are both n-channel voltage-driven switching elements. More specifically, the two transistors 11, 12 are MOS transistors (Metal-Oxide-Semiconductor Transistors) of a n-channel type. A MOS transistor of the n-channel type turns on and off by a relative voltage of its gate with a source potential as a reference. Specifically, it turns on (a drain and a source thereof are electrically connected) when a gate voltage is higher than a source voltage. It turns off (the drain and the source are cut off from each other) when the gate voltage is equal to or less than the source voltage.

Hereinbelow, for the convenience of explanation, a drain D1, a source S1, and a gate G1 of the first transistor 11 are respectively termed a first drain D1, a first source S1, and a first gate G1, and a drain D2, a source S2, and a gate G2 of the second transistor 12 are respectively termed a second drain D2, a second source S2, and a second gate G2.

The first transistor 11 is connected between the power terminal 15 and the output terminal 17. More specifically, the drain (first drain D1) of the first transistor 11 is connected with the power terminal 15 and the source (first source S1) of the first transistor 11 is connected with the output terminal 17. The diode 13 has its anode connected with the first source S1 (output terminal 17) and its cathode connected with the gate (first gate G1) of the first transistor 11.

The power terminal 15 has an external power source 20 connected therewith. The power source 20 is configured to supply a voltage required at the output terminal 17 of the output circuit 10. The power source 20 may be provided inside the output circuit 10. An output voltage of the power source 20 is denoted by a sign VH (power source voltage VH).

The resistive element 14 is connected between the power terminal 15 (power source 20) and the gate (first gate G1) of the first transistor 11. The second transistor 12 is connected between the first gate G1 and the ground terminal 18. More specifically, the drain (second drain D2) of the second transistor 12 is connected with the first gate G1 (cathode of the diode 13) and the source (second source S2) of the second transistor 12 is connected with the ground terminal 18. The ground terminal 18 is shared by an input side and an output side. The gate (second gate G2) of the second transistor 12 is connected with the input terminal 16.

As above, the output circuit 10 has an extremely simple structure. The output circuit 10 is configured to suppress through-current and switch the voltage of the output terminal between the LOW level (ground potential) and the HIGH level (voltage VHO) with the simple structure. The "through-current" is current that flows directly from a high potential terminal (that is, the power source 20) to a low potential terminal (that is, the ground terminal 18) when the two transistors (the first transistor 11 and the second transistor 12) connected in series respectively switch. Hereinbelow, a mechanism by which the through-current is suppressed will be described together with an operation of the output circuit 10.

Figure 2:
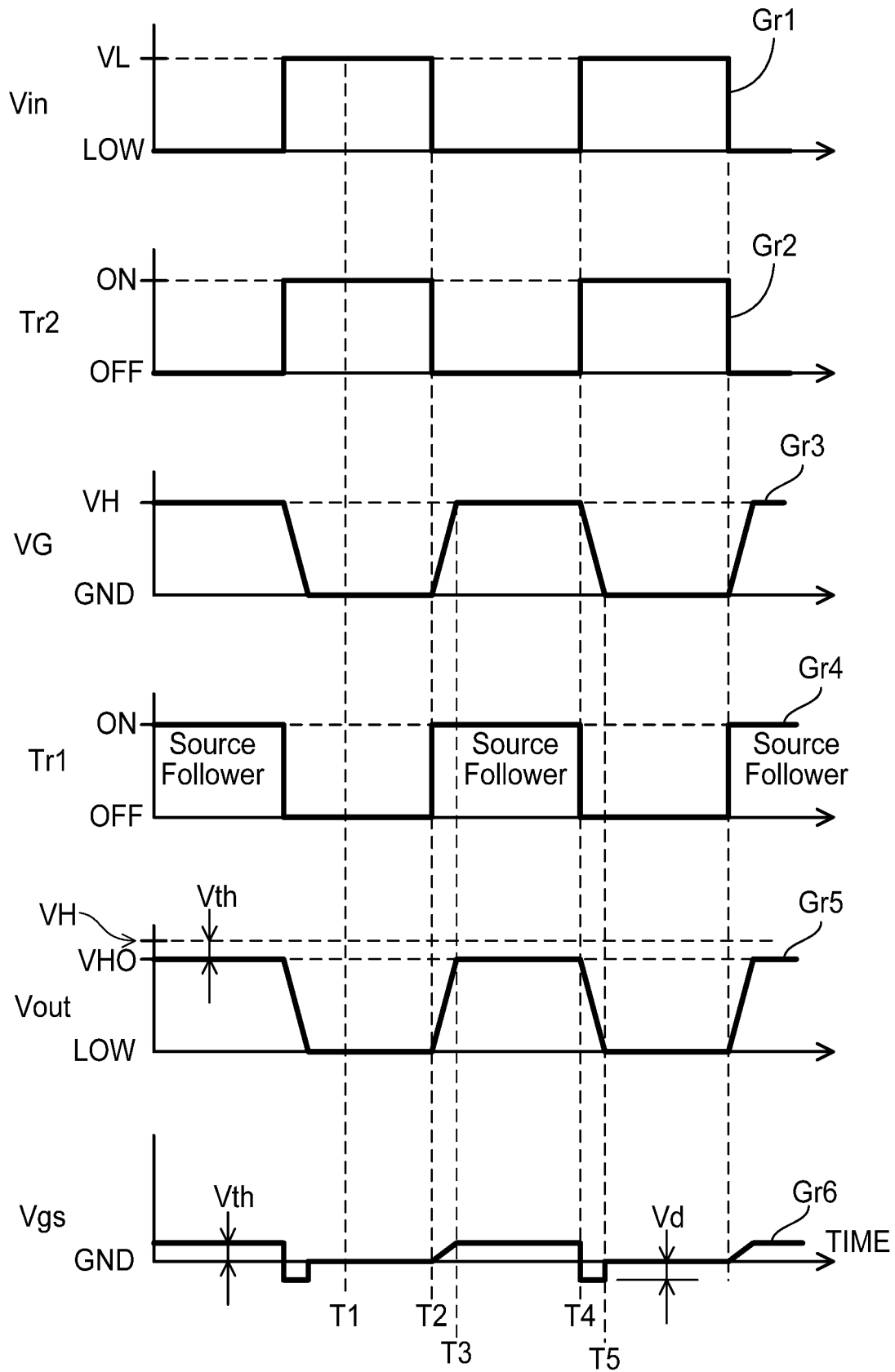
FIG. 2 is a timing chart of respective parts of the output circuit.

FIG. 2 is a timing chart of respective parts of the output circuit 10. The operation of the output circuit 10 will be described with reference to FIG. 2 as well as FIG. 1. A graph Gr1 in FIG. 2 is a timing chart of an input pulse signal Vin applied to the input terminal 16. A graph Gr2 is a timing chart of the second transistor 12. A sign Tr2 in FIG. 2 indicates the second transistor 12.

A graph Gr3 is a timing chart of the voltage (gate voltage VG) of the first gate G1 (gate of the first transistor 11). A graph Gr4 is a timing chart of the first transistor 11. A sign Tr1 in FIG. 2 indicates the first transistor 11. A graph Gr5 is a timing chart of a signal outputted from the output terminal 17 (output pulse signal Vout). A graph Gr6 is a timing chart of the voltage of the gate (first gate G1) relative to the source (first source S1) of the first transistor 11 (gate voltage difference Vgs). As aforementioned, the n-channel voltage-driven first transistor 11 turns on when the voltage of the first gate G1 is higher than the threshold voltage Vth of the first transistor 11 with the voltage of the first source S1 as the reference. That is, the first transistor 11 is maintained in an on-state during a period in which the gate voltage difference Vgs is larger than the threshold voltage Vth. Although this will be described later in detail, the first transistor 11 is not specifically maintained in the on-state, but rather performs a source follower operation. In FIG. 2, a source follower period of the first transistor 11 (period indicated as "Source Follower") is indicated as "ON" for convenience sake.

The LOW level of the input pulse signal Vin and the LOW level of the output pulse signal Vout both correspond to the ground potential (potential of the ground terminal 18).

The explanation will be given starting from time T1 in the timing chart of FIG. 2. At time T1, the input pulse signal Vin is maintained at the HIGH level (voltage VL). Since the gate (second gate G2) of the second transistor 12 is connected with the input terminal 16, the second transistor 12 is switched between on and off in synchrony with the input pulse signal Vin. More specifically, the second transistor 12 is maintained in an on-state while the input pulse signal Vin is maintained at the HIGH level. When the input pulse signal Vin switches from the HIGH level to the LOW level, the second transistor 12 is switched from on to off immediately without delay. The second transistor 12 is maintained in an off-state while the input pulse signal Vin is maintained at the LOW level. When the input pulse signal Vin switches from the LOW level to the HIGH level, the second transistor 12 is switched from off to on immediately without delay.

The second drain D2 is maintained at the ground potential while the second transistor 12 is maintained in the on-state. As a result, the voltage (gate voltage VG) of the first gate G1 connected with the second drain D2 is also maintained at the ground potential (see the graph Gr3).

Since the gate voltage VG is maintained at the ground potential, the first transistor 11 is maintained in an off-state (see the graph Gr4). That is, the first source S1 is cut off from the first drain D1 (power source 20). On the other hand, since the diode 13 allows the current to flow from the output terminal 17 (first source S1) to the first gate G1, the voltage (output voltage Vout) of the output terminal 17 (first source S1) is also maintained at the ground potential (see the graph Gr5). Due to both the voltage (gate voltage VG) of the first gate G1 and the voltage of the first source S1 being at the ground potential, the voltage difference Vgs is zero (ground level) (see the graph Gr6).

An element with a sufficiently large resistance is employed as the resistive element 14. When the resistance of the resistive element 14 is not sufficiently large, wasteful current flows from the power source 20 to the ground terminal 18 while the second transistor 12 is in the on-state. The resistance of the resistive element 14 may be 1 [MΩ] or more.

At time T2, the input pulse signal Vin switches from the HIGH level to the LOW level. As aforementioned, the second transistor 12 is switched between on and off in synchrony with the input pulse signal Vin. That is, the second transistor 12 switches from on to off at time T2 (see the graph Gr2).

When the second transistor 12 switches to off, the second drain D2 (or first gate G1) is cut off from the ground terminal 18. Since the second drain D2 (or first gate G1) is connected with the power source 20 (power terminal 15) via the resistive element 14, the voltage of the second drain D2 (or first gate G1) gradually rises from time T2 (see the graph Gr3). The voltage of the second drain D2 equals to the gate voltage VG of the first gate G1.

As aforementioned, both the gate (first gate G1) and the source (first source S1) of the first transistor 11 were maintained at the ground potential before time T2. Further, the first transistor 11 being the n-channel voltage-driven element turns on when the gate voltage difference Vgs exceeds the threshold voltage Vth. After the first transistor 11 is turned on, the first transistor 11 performs the source follower operation. Since the first source S1 is connected with the output terminal 17, the voltage of the output terminal 17 (voltage of the output pulse signal Vout) also rises in synchrony with the voltage (gate voltage VG) of the first gate G1 (see the graph Gr5).

The first gate G1 rises to the power source voltage VH at time T3. On the other hand, the voltage (output voltage Vout) of the output terminal 17 connected to the load 30 stops at a value that is lower than the power source voltage VH by the threshold voltage Vth of the first transistor 11 (graph Gr5, time T3). That is, a maximum voltage of the output terminal 17 is VHO (=the power source voltage VH−the threshold voltage Vth). By providing the power source 20 having the output voltage VH that is higher than the voltage VL of the input pulse signal Vin at the HIGH level, the output circuit 10 is configured to amplify and output the input pulse signal. However, the output pulse signal becomes the inverted signal of the input pulse signal.

When the input pulse signal switches from the HIGH level to the LOW level at time T2, the second transistor 12 immediately switches from on to off. After this, the voltage of the drain (first drain D1) of the first transistor 11, that is, the voltage of the output terminal 17, gradually rises. As such, the power source 20 and the ground terminal 18 are suppressed from short circuiting through the transistors 11, 12, and the through-current does not flow.

In FIG. 2, the first transistor 11 is depicted for the convenience of explanation to be at the ON level during when the input pulse signal Vin is at the LOW level. However, during when the input pulse signal Vin is at the LOW level, the first transistor 11 in fact repeats to turn on and off in order for the output terminal 17 (first source S1) to maintain the voltage VHO (=VH−Vth) regardless of changes in a state of the load 30. This operation is called the source follower operation (source follower).

The source follower operation will be described. When the voltage of the load 30 (voltage of the output terminal 17) drops, the voltage (gate voltage VG) of the first gate G1 rises relative thereto, and the first transistor 11 turns on. Since the first transistor 11 turns on, power is supplied from the power source 20 to the load 30. As a result, the voltage of the load 30 (voltage of the output terminal 17) rises.

On the other hand, when the voltage of the load 30 (voltage of the output terminal 17) becomes high, the voltage of the first gate G1 becomes low relative thereto, and the first transistor 11 turns off. When the first transistor 11 turns off, the power supply from the power source 20 to the load 30 is interrupted. As a result, the voltage of the load 30 (voltage of the output terminal 17) drops. The first transistor 11 repeats to turn on and off as above so that the voltage of the output terminal 17 maintains a constant value (the voltage VHO=the power source voltage VH−the threshold voltage Vth).

Then, the input pulse signal Vin switches from the LOW level to the HIGH level at time T4. When the input pulse signal Vin switches to the HIGH level, the second transistor 12 immediately switches from off to on. Since the second drain D2 and the second source S2 are thereby electrically connected, the voltage of the second drain D2 (that is, the first gate G1) starts to drop. The voltage VG of the first gate G1 is maintained at the power source voltage VH and the first source S1 is maintained at the voltage VHO=VH−Vth (<VH) during when the input pulse signal Vin is at the LOW level. Since the diode 13 is in a reverse-biased state while the voltage VG of the first gate G1 is higher than the voltage of the first source S1, current does not flow from the power source 20 to the first gate G1 (that is, the second drain D2) through the drain/source of the first transistor 11. When the second transistor 12 switches to the on-state, the voltage of the second drain D2 (voltage VG of the first gate G1) starts to drop, and the first transistor 11 turns off. The diode 13 turns on when the voltage of the second drain D2 (voltage VG of the first gate G1) becomes equal to or lower than "the voltage of the first source S1+a forward voltage Vf of the diode 13", however, since the first transistor 11 is already in the off-state, current does not flow from the power source 20 to the first gate G1 (that is, the second drain D2) through the drain/source of the first transistor 11. That is, the through-current is suppressed also when the input pulse signal Vin switches from off to on.

After this, the voltage of the output terminal 17 (output voltage Vout) also drops by an effect of the diode 13 as the voltage of the second drain D2 drops. At time T5, the voltage of the second drain D2 (voltage VG of the first gate G1) and the output voltage Vout drop to the ground level.

The graph Gr6 of FIG. 2 shows the voltage difference Vgs of the first gate G1 relative to the first source S1. As aforementioned, the voltage difference Vgs is equal to the threshold voltage Vth of the first transistor 11 during when the input pulse signal Vin is at the LOW level. When the input pulse signal switches to HIGH level at time T4, the voltage of the second drain D2 (voltage VG of the first gate G1) drops, and the voltage of the first source S1 drops as if to follow the aforementioned voltage drop. The voltage difference Vgs being a negative value Vd during a period from time T4 to time T5 means that there is a delay in the voltage of the first source S1 following the second drain D2 (voltage VG of the first gate G1). Since both the voltage of the second drain D2 (voltage VG of the first gate G1) and the output voltage Vout (voltage of the first source S1) drop to the ground level at time T5, the voltage difference Vgs thereby becomes zero.

As explained above, the output circuit 10 can suppress the through-current and switch the output terminal between the LOW level and the HIGH level despite having a simple circuit structure.

Second Embodiment

Figure 3:
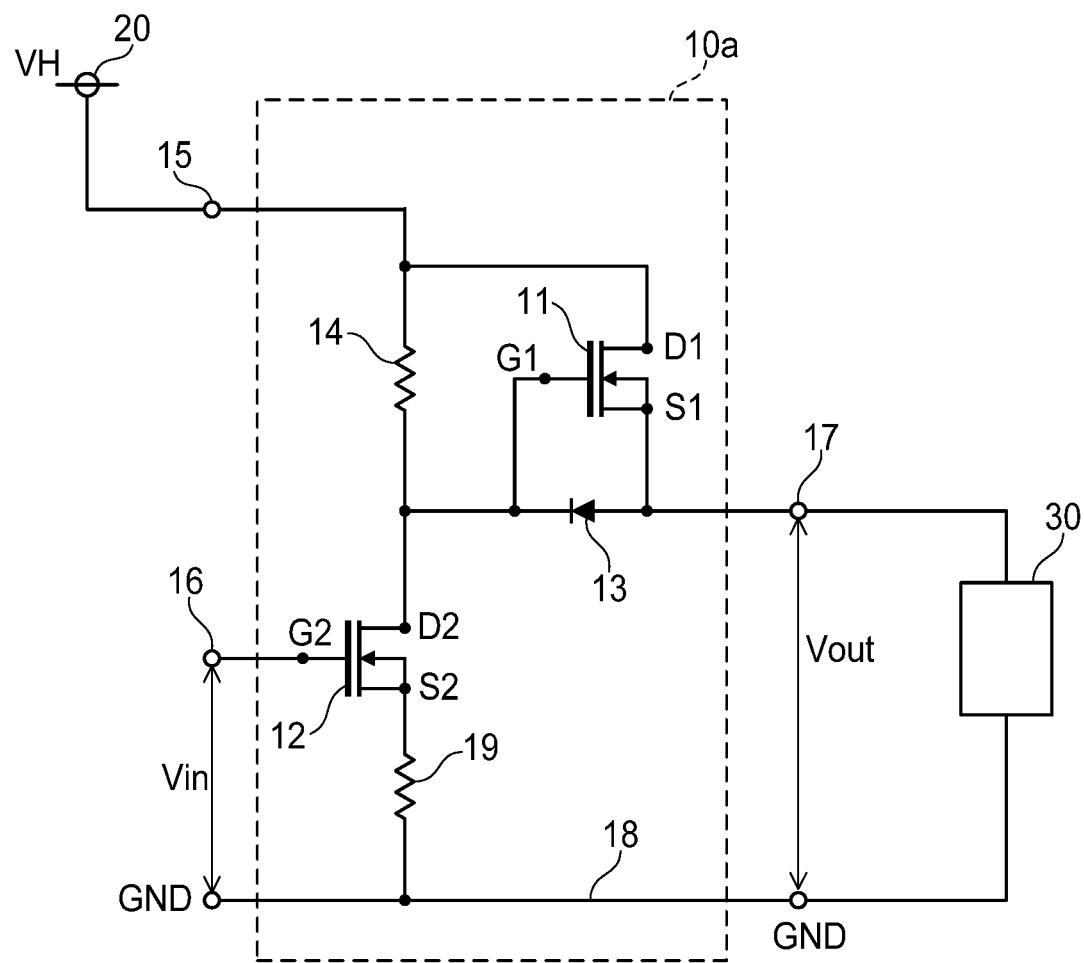
FIG. 3 is a circuit diagram of an output circuit of a second embodiment.

FIG. 3 shows a circuit diagram of an output circuit 10*a* of a second embodiment. The output circuit 10*a* of the second embodiment differs from the output circuit 10 of the first embodiment only in that it is provided with an additional resistive element 19 between the second source S2 and the ground terminal 18. The output circuit 10*a* achieves same advantages as the output circuit 10.

An advantage of adding the additional resistive element 19 will be described. When the second transistor 12 switches from off to on, the voltage of the second drain D2 (voltage VG of the first gate G1) promptly drops, however, a voltage drop of the output terminal 17 (first source S1) is delayed due to a response delay generated when the diode 13 switches from off to on. In this case, there is a risk that the voltage of the first gate G1 drops tremendously relative to the voltage of the first source S1. That is, there is a risk that the negative value of the voltage difference Vgs at time T4 in the time chart in the graph Gr6 of FIG. 2 becomes excessively large. An excessively large voltage difference Vgs between the first source S1 and the first gate G1 risks the first transistor 11 of being damaged. By introducing the additional resistive element 19, a voltage change that takes place when the second transistor 12 switches from off to on becomes moderate. That is, a change in the voltage of the second drain D2 becomes moderate. As a result, the voltage difference Vgs when the second transistor 12 shifts from off to on is suppressed, and burden on the first transistor 11 is thereby alleviated.

As aforementioned, the output circuit 10*a* of the second embodiment exhibits excellent effect when an operating frequency of the diode 13 is slower than an operating frequency of the second transistor 12. A resistance of the additional resistive element 19 is smaller than a resistance of the resistive element 14. Further, same effect is achieved even when a location where the additional resistive element 19 is to be added is changed to between the input terminal 16 and the second gate G2. By adding the additional resistive element 19, same effect as a case of decreasing the operating frequency of the second transistor 12 is achieved, and defects caused by a difference in the operating frequencies of the diode 13 an the second transistor 12 can be reduced.

Third Embodiment

Figure 4:
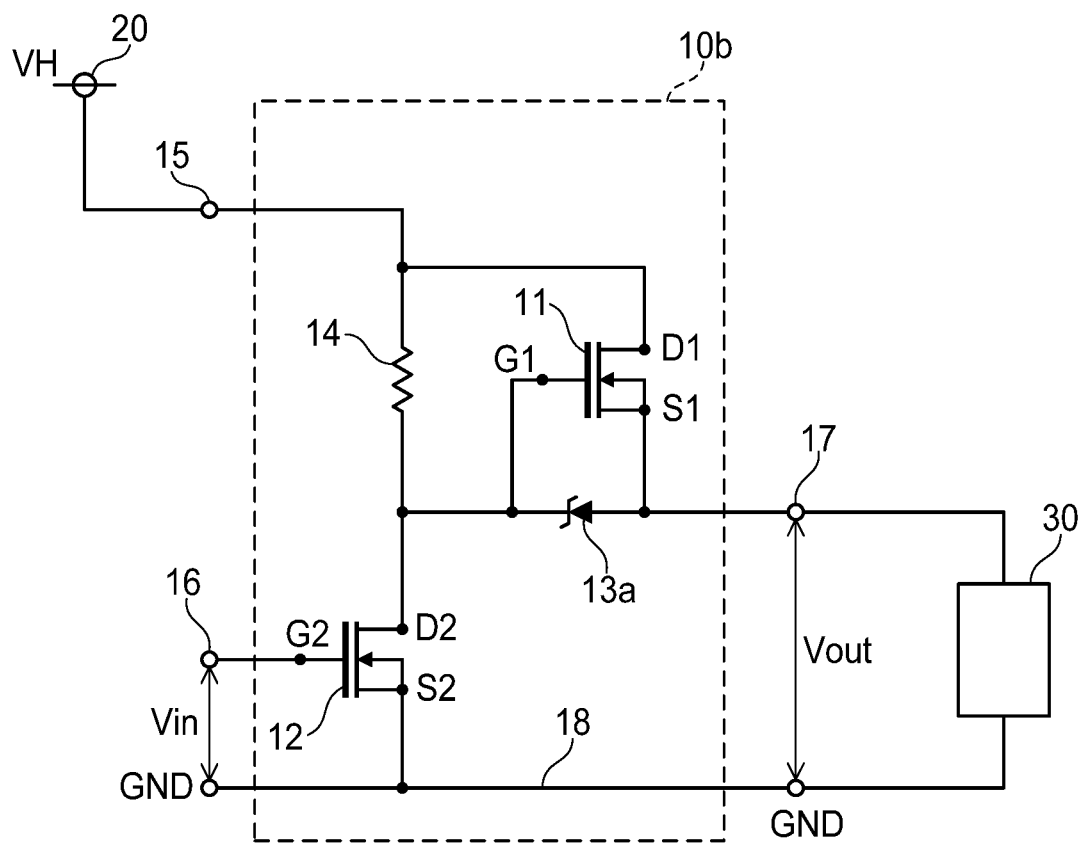
FIG. 4 is a circuit diagram of an output circuit of a third embodiment.

FIG. 4 shows a circuit diagram of an output circuit 10*b* of a third embodiment. The output circuit 10*b* of the third embodiment differs from the output circuit 10 of the first embodiment only in that its diode 13*a* is a Zener diode. The output circuit 10*b* achieves same advantages as the output circuit 10.

An advantage of changing the diode 13 of the output circuit 10 to the Zener diode 13*a* will be described. As aforementioned, the first transistor 11 is at the risk of being damaged when the voltage difference Vgs between the first source S1 and the first gate G1 becomes excessively large. The voltage difference Vgs is at a risk of becoming large when the voltage of the load 30 drops due to some reason while the first transistor 11 is maintained in the on-state. By changing the diode 13 to the Zener diode 13*a*, current flows from the power source 20 to the load 30 through the resistive element 14 and the Zener diode 13*a* when the voltage of the load 30 drops tremendously, by which a voltage drop of the load 30 can be suppressed. As a result, a damage to the first transistor 11 can be suppressed.

Fourth Embodiment

Figure 5:
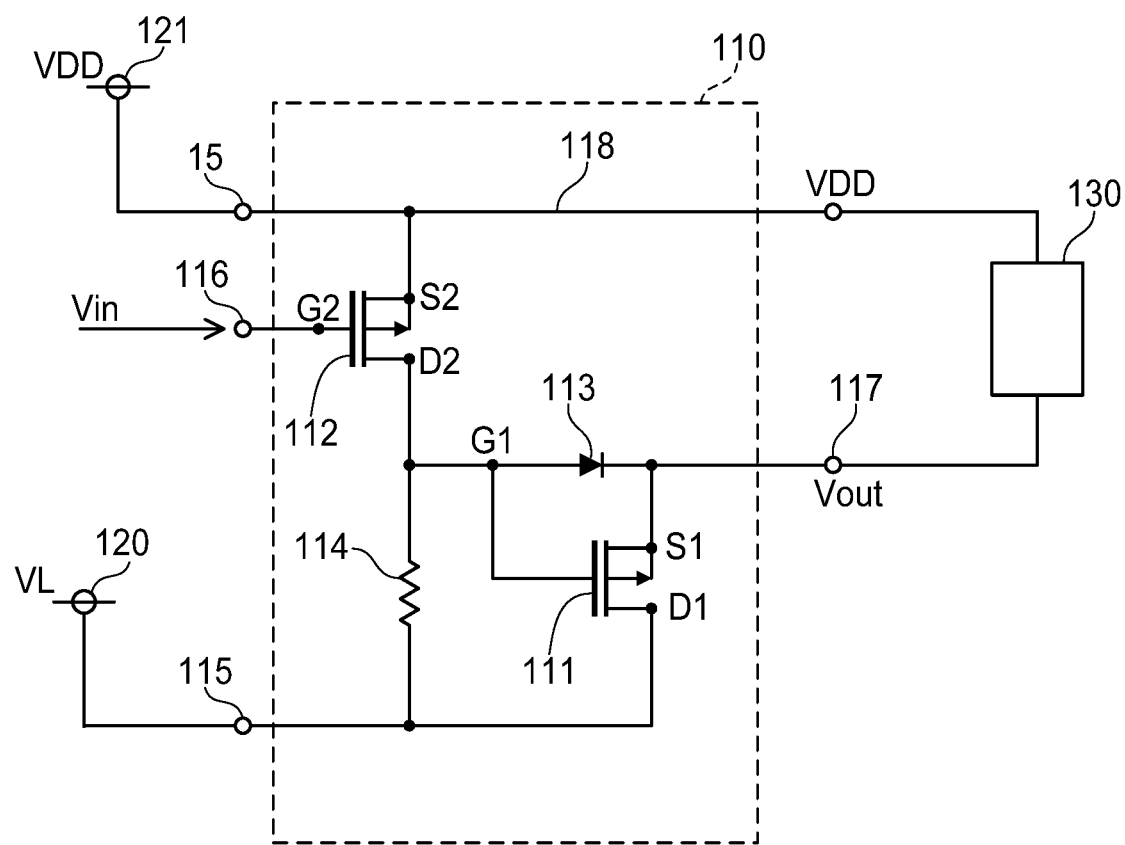
FIG. 5 is a circuit diagram of an output circuit of a fourth embodiment.

FIG. 5 shows a circuit diagram of an output circuit 110 of a fourth embodiment. The output circuit 110 of the fourth embodiment is an output circuit configured to execute level conversion of an input pulse signal having a low voltage to a pulse signal having a LOW level with a high voltage being of a negative value (being an output circuit for a negative value). The output circuit 110 for the negative value is used to drive a load 130 which operates with a pulse signal having a LOW level with a negative high voltage.

The output circuit 110 includes two p-channel voltage-driven transistors (a first transistor 111 and a second transistor 112), a diode 113, and a resistive element 114. The first transistor 111 and the second transistor 112 are both p-channel voltage-driven MOSFETS. Further, the output circuit 110 includes an input terminal 116, an output terminal 117, a circuit power terminal 118, and a drive power terminal 115 as its input/output terminals. In this embodiment as well, a drain, a source, and a gate of the first transistor 111 are respectively termed a first drain D1, a first source S1, and a first gate G1, and a drain, a source, and a gate of the second transistor 112 are respectively termed a second drain D2, a second source S2, and a second gate G2. In a case of a p-channel type transistor, its source corresponds to a positive electrode and its drain corresponds to a negative electrode.

The first source S1 is connected with the output terminal 117 and the first drain D1 is connected with the drive power terminal 115. An anode of the diode 113 is connected with the first gate G1 and a cathode thereof is connected with the first source S1. The resistive element 114 is connected between the first gate G1 and the drive power terminal 115. The second source S2 is connected with the circuit power terminal 118, and the second drain D2 is connected with the first gate G1. The second gate G2 is connected with the input terminal 116. The circuit power terminal 118 has a power source (circuit power source 121) for operating the output circuit 110 including the first transistor 111 and the second transistor 112 connected thereto. An output voltage of the circuit power source 121 is of a positive value, and is for example 5 volts at a TTL level. The drive power terminal 115 has a drive power source 120 configured to output a voltage of a negative value required for driving the load 130 connected thereto. The output voltage of the circuit power source 121 will be termed a circuit voltage VDD and the output voltage of the drive power source 120 will be termed a drive voltage VL. Here, the drive voltage VL is of the negative value, and an absolute value of the drive voltage VL is significantly larger than the circuit voltage VDD.

A resistor (a resistive element) with a high resistance is employed as the resistive element 114 so that wasteful current does not flow from the circuit power source 121 to the drive power terminal 115 when the second transistor 112 turns on. The resistance of the resistive element 114 may be equal to or greater than 1 [MΩ].

Each of the first transistor 111 and the second transistor 112 is of the p-channel type, and is configured to turn on when a voltage of its gate becomes lower than a voltage of its source, and turns off when the voltage of its gate becomes equal to the voltage of its source. The first gate G1 of the first transistor 111 is connected with the first source S1 via the diode 113 (with the anode thereof connected with the first gate G1). With this connection relationship, the first transistor 111 repeats to turn on and off so that the voltage of the first source S1 becomes equal to the voltage of the first gate G1.

An operation of the output circuit 110 will be described. When an input pulse signal Vin is at a LOW level, the second transistor 112 is maintained in an on-state. A voltage of the second drain D2 comes to be at a voltage equal to the circuit voltage VDD when the second transistor 112 is maintained in the on-state. Since the first transistor 111 operates to bring the voltage of the first source S1 to be equal to the voltage of the first gate G1, the voltage of the first source S1 is also maintained at the circuit voltage VDD. A voltage difference between both terminals of the load 130 becomes zero volt. The first transistor 111 is maintained in an off-state, so current does not flow from the first source S1 to the first gate G1 by the diode 113. Thus, no current flows to the load 130.

When the input pulse signal Vin switches from the LOW level to a HIGH level, the second transistor 112 immediately switches from on to off. The voltage of the second drain D2, that is, the voltage of the first gate G1 drops to the drive voltage VL and the first transistor 111 switches from off to on, by which the voltage of the first source S1 also drops. The first gate G1 drops to the drive voltage VL, however, the first transistor 11 performs a source follower operation, by which the voltage of the first source S1 remains at a voltage obtained by adding a threshold voltage Vth of the first transistor to the drive voltage VL. Since the first transistor 111 turns on after the second transistor 112 has turned off, through-current is thereby suppressed.

When the input pulse signal Vin switches from the HIGH level to the LOW level, the second transistor 112 immediately switches from off to on. The voltage of the second drain D2 rises from the drive voltage VL to the circuit voltage VDD. The first transistor 111 switches from on to off concurrently as the voltage of the second drain D2 starts to rise. At this occasion, during when the voltage of the second drain D2 (voltage of the first gate G1) is lower than "the voltage of the first source S1+a forward voltage Vf of the diode 113", current does not flow from the second drain D2 of the second transistor 112 to the first source S1 of the first transistor 111 by a rectification behavior of the diode 113. When the voltage of the second drain D2 rises to or higher than "the voltage of the first source S1+the forward voltage Vf of the diode 113", the diode 113 switches from off to on, by which a voltage of the output terminal 117 also rises to the circuit voltage VDD. Thus, in this case as well, current does not flow through the source/drain of the first transistor 111. The through-current is suppressed also when the input pulse signal Vin switches from the LOW level to the HIGH level. As above, the output circuit 110 of FIG. 5 is also capable of suppressing the through-current and outputting a pulse signal with a large voltage amplitude.

Some features of the art described in the embodiments will be listed. The circuit diagrams of FIG. 1 (and FIGS. 3 to 5) show their minimum configurations. Passive elements such as a resistor and a capacitor for noise removal may be added to the configurations of FIG. 1 (as well as FIGS. 3 to 5).

The output circuit 10 (as well as the output circuits 10a, 10b) of the first to third embodiments each employ two n-channel type MOS transistors. Switching elements in an output circuit disclosed herein are not limited to MOS transistors. The switching elements of the output circuit may simply be n-channel voltage-driven elements.

The output circuits 10, 10a, 10b of the embodiments may each be used as a level converter configured to convert a voltage of a HIGH level of an input pulse signal, or as a driver for a load that operates by a pulse signal with a voltage difference larger than a voltage difference of an input pulse signal.

The first transistor 11 and the second transistor 12 in the respective embodiments are examples of a first switching element and a second switching element, respectively. The first drain D1 and the first source S1 in the first to third embodiments are examples of a first positive electrode and a first negative electrode, respectively. The second drain D2 and the second source S2 are examples of a second positive electrode and a second negative electrode, respectively.

In the fourth embodiment, the first source S1 and the first drain D1 are examples of the first positive electrode and the first negative electrode, respectively, and the second source S2 and the second drain D2 are examples of the second positive electrode and the second negative electrode, respectively.

The output circuit 110 of the fourth embodiment employs two p-channel type MOS transistors. Switching elements in an output circuit for a negative value that are disclosed herein are not limited to MOS transistors. The switching elements in the output circuit for the negative value may simply be p-channel voltage-driven elements.

Specific examples of the present disclosure have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. An output circuit comprising:
   an input terminal;
   an output terminal;
   a ground terminal shared by both an input side and an output side of the output circuit;
   a first switching element of an n-channel type, the first switching element having a first positive electrode, a first negative electrode, and a first gate;
   a second switching element of the n-channel type, the second switching element having a second positive electrode, a second negative electrode, and a second gate;
   a diode; and
   a resistive element;
   wherein
   the first positive electrode is connected with a power source,
   the first negative electrode is connected with the output terminal,
   an anode of the diode is connected with the first negative electrode,
   a cathode of the diode is connected with the first gate,
   the resistive element is connected between the power source and the first gate,
   the second positive electrode is connected with the first gate,
   the second negative electrode is connected with the ground terminal, and
   the second gate is connected with the input terminal.

2. The output circuit of claim 1, further comprising an additional resistive element connected between the second negative electrode and the ground terminal, wherein a resistance of the additional resistive element is smaller than a resistance of the resistive element.

3. The output circuit of claim 1, wherein the diode is a Zener diode.

4. An output circuit comprising:
   an input terminal;
   an output terminal;
   a circuit power terminal connected with a first power source configured to supply a first voltage, the first voltage being of a positive value;
   a drive power terminal connected with a second power source configured to supply a second voltage, the second voltage being of a negative value;
   a first switching element of a p-channel type, the first switching element having a first positive electrode, a first negative electrode, and a first gate;
   a second switching element of the p-channel type, the second switching element having a second positive electrode, a second negative electrode, and a second gate;
   a diode; and
   a resistive element;
   wherein
   the first positive electrode is connected with the output terminal,
   the first negative electrode is connected with the drive power terminal,
   an anode of the diode is connected with the first gate,
   a cathode of the diode is connected with the first positive electrode,
   the resistive element is connected between the first gate and the drive power terminal,
   the second positive electrode is connected with the circuit power terminal,
   the second negative electrode is connected with the first gate, and
   the second gate is connected with the input terminal.

* * * * *